United States Patent
Byeon

(10) Patent No.: US 8,049,552 B2
(45) Date of Patent: Nov. 1, 2011

(54) INTERNAL VOLTAGE GENERATOR OF SEMICONDUCTOR DEVICE

(75) Inventor: Sang-Jin Byeon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/429,782

(22) Filed: Apr. 24, 2009

(65) Prior Publication Data
US 2010/0141332 A1 Jun. 10, 2010

(30) Foreign Application Priority Data
Dec. 5, 2008 (KR) .................. 10-2008-0123479

(51) Int. Cl.
*G05F 1/10* (2006.01)
(52) U.S. Cl. .................. 327/536; 327/156; 327/534
(58) Field of Classification Search .......... 327/534–537, 327/156–157
See application file for complete search history.

(56) References Cited

U.S. PATENT DOCUMENTS
2007/0279123 A1* 12/2007 Byeon et al. .................. 327/536

FOREIGN PATENT DOCUMENTS
KR   1020070115712   12/2007

OTHER PUBLICATIONS
Notice of Preliminary Rejection issued from Korean Intellectual Property Office on May 27, 2010.

* cited by examiner

*Primary Examiner* — Lincoln Donovan
*Assistant Examiner* — Shikha Goyal
(74) *Attorney, Agent, or Firm* — IP & T Group LLP

(57) ABSTRACT

An internal voltage generator of a semiconductor device includes a charge pumping unit for performing a charge pumping operation on the basis of the voltage level of a reference voltage to generate a charge pumped voltage having a voltage level higher than the external power supply voltage; and an internal voltage generating unit for performing a charge pumping operation on the basis of an internal voltage level that is linear with respect to a temperature change in a first temperature range to generate an internal voltage, and to perform a charge pumping operation on the basis of an internal voltage clamping level that is constant independent of a temperature change in a second temperature range to generate the internal voltage.

29 Claims, 9 Drawing Sheets

INTERNAL VOLTAGE GENERATOR OF SEMICONDUCTOR DEVICE

CROSS-REFERENCE TO RELATED APPLICATIONS

The present invention claims priority of Korean patent application number 10-2008-0123479, filed on Dec. 5, 2008, the disclosure of which is incorporated by reference herein in its entirety.

BACKGROUND OF THE INVENTION

The present invention relates to semiconductor design technology, and in particular, to an internal voltage generator of a semiconductor device that operates stably even in a low power supply voltage environment. More particularly, the present invention relates to a voltage detecting circuit of an internal voltage generator that operates stably even in a low power supply voltage environment.

Most semiconductor devices, including dynamic random access memories (DRAMs), generate and use not only an external power supply voltage (e.g., VDD and VSS) but also an internal voltage having a different level than the power supply voltage. In general, the internal voltage is generated by a charge pumping mode or a voltage down converting mode by using an external power supply voltage VDD, an external ground voltage VSS and a reference voltage corresponding to the target level of the internal voltage.

A high-level voltage VPP and a back-bias voltage VBB are examples of the internal voltage of the DRAM generated by the charge pumping mode. Also, a core voltage VCORE and a bitline precharge voltage VBLP are examples of the internal voltage of the DRAM generated by the voltage down converting mode.

The high-level voltage VPP has a higher voltage level than the external power supply voltage VDD, which is generally used to drive a wordline. On the other hand, the back-bias voltage VBB is a negative voltage lower than the external ground voltage VSS, which is generally used as a body (or bulk) bias of a cell transistor (e.g., an NMOS transistor).

FIG. 1 is a block diagram of a conventional back-bias voltage (VBB) generator. Referring to FIG. 1, the conventional back-bias voltage generator includes a back-bias reference voltage generating unit 50, a back-bias voltage detector 10, an oscillator 20, a pump controller 30, and a charge pump 40. The back-bias reference voltage generating unit 50 is configured to receive an external power supply voltage VDD to perform a voltage down converting operation on the basis of the voltage level of a reference voltage VREF to generate a back-bias reference voltage VREFB that maintains a predetermined target level. The back-bias voltage detector 10 is configured to receive the back-bias reference voltage VREFB and a back-bias voltage VBB, which is fed back from a back-bias voltage output terminal, to output an enable signal BBEb. The oscillator 20 is configured to output an oscillation signal OSC with a predetermined oscillation frequency in response to the enable signal BBEb. The pump controller 30 is configured to receive the oscillation signal OSC to generate a pump control signal PUMP_CTRL. The charge pump 40 is configured to perform a negative charge pumping operation on the back-bias voltage output terminal in response to the pump control signal PUMP_CTRL.

Herein, the reference voltage VREF always maintains the predetermined target level regardless of a temperature change and a voltage level change of the external power supply voltage VDD. In general, the reference voltage VREF is generated by a bandgap reference circuit that operates by receiving the external power supply voltage VDD.

When a power supply voltage is externally applied to stabilize the voltage level of the external power supply voltage VDD above a predetermined level, a power-up signal is activated to initiate the voltage generating operation of all the internal voltage generators including the back-bias voltage generator and the bandgap reference circuit. The back-bias voltage output terminal has a ground voltage (VSS) level before the initiation of the voltage generating operation of the back-bias voltage generator. The back-bias voltage detector 10 detects the ground voltage level of the back-bias voltage output terminal to activate the enable signal BBEb to a logic low level, thereby enabling the oscillator 20. When the oscillator 20 is enabled to output the oscillation signal OSC with the predetermined oscillation frequency, the pump controller 30 receives the oscillation signal OSC to generate the pump control signal PUMP_CTRL and the charge pump 40 performs a negative charge pumping operation in response to the pump control signal PUMP_CTRL. This charge pumping operation continues until the voltage level of the back-bias voltage output terminal reaches the target level determined according to the back-bias reference voltage VREFB.

Conventionally, the back-bias voltage detector 10 of FIG. 1 includes a back-bias voltage normal detector, a back-bias voltage modulation detector, a back-bias voltage high clamping detector, and a back-bias voltage low clamping detector, and a detection signal combination circuit. The back-bias voltage normal detector is configured to detect the voltage level of the back-bias voltage VBB that is constant independent of a temperature change. The back-bias voltage modulation detector is configured to detect the voltage level of the back-bias voltage VBB that is linearly dependent on a temperature change. The back-bias voltage high clamping detector is configured to detect the highest (absolute) clamping level of the back-bias voltage VBB that is constant independent of a temperature change. The back-bias voltage low clamping detector is configured to detect the lowest (absolute) clamping level of the back-bias voltage VBB that is constant independent of a temperature change. The detection signal combination circuit is configured to combine detection signals, which are outputted respectively from the back-bias voltage modulation detector, the back-bias voltage high clamping detector, and the back-bias voltage low clamping detector, to generate a combined detection signal.

FIG. 2 is a circuit diagram of the back-bias voltage detector 10 of FIG. 1, which includes a back-bias voltage normal detector 10A, a back-bias voltage modulation detector 10B, a back-bias voltage high clamping detector 10C, and a back-bias voltage low clamping detector 10D, and a detection signal combining unit 10E.

Referring to FIG. 2, the back-bias voltage normal detector 10A includes a first PMOS transistor P1, a second PMOS transistor P2, and a first inverter INV1. The first PMOS transistor P1 has a gate connected to receive a ground voltage VSS, a source and a bulk connected to receive a back-bias reference voltage VREFB, and a drain connected to a first detection node NODE_1. The second PMOS transistor P2 has a gate connected to receive a back-bias voltage VBB, a drain connected to receive the ground voltage VSS, a bulk connected to receive the back-bias reference voltage VREFB, and a source connected to the first detection node NODE_1. The first inverter INV1 is configured to have an input terminal, which is connected to the first detection node NODE_1, to output a normal detection signal DET_N.

The back-bias voltage modulation detector 10B includes a third PMOS transistor P3, an NMOS transistor N1, and a second inverter INV2. The third PMOS transistor P3 has a gate connected to receive the ground voltage VSS, a source and a bulk connected to receive the back-bias reference voltage VREFB, and a drain connected to a second detection node NODE_2. The NMOS transistor N1 has a gate connected to receive the back-bias reference voltage VREFB, a source and a bulk connected to receive the back-bias voltage VBB, and a drain connected to the second detection node NODE_2. The second inverter INV2 is configured to have an input terminal, which is connected to the second detection node NODE_2, to output a modulation detection signal DET_T.

The back-bias voltage high clamping detector 10C includes a fourth PMOS transistor P4, a fifth PMOS transistor P5, and a third inverter INV3. The fourth PMOS transistor P4 has a gate connected to receive the ground voltage VSS, a source and a bulk connected to receive the back-bias reference voltage VREFB, and a drain connected to a third detection node NODE_3. The fifth PMOS transistor P4 has a gate connected to receive the back-bias voltage VBB, a drain connected to receive the ground voltage VSS, a bulk connected to receive the back-bias reference voltage VREFB, and a source connected to the third detection node NODE_3. The third inverter INV3 is configured to have an input terminal, which is connected to the third detection node NODE_3, to output a high clamping detection signal DET_H.

The back-bias voltage low clamping detector 10D includes a sixth PMOS transistor P6, a seventh PMOS transistor P7, and a fourth inverter INV4. The sixth PMOS transistor P6 has a gate connected to receive the ground voltage VSS, a source and a bulk connected to receive the back-bias reference voltage VREFB, and a drain connected to a fourth detection node NODE_4. The seventh PMOS transistor P7 has a gate connected to receive the back-bias voltage VBB, a drain connected to receive the ground voltage VSS, a bulk connected to receive the back-bias reference voltage VREFB, and a source connected to the fourth detection node NODE_4. The fourth inverter INV4 is configured to have an input terminal, which is connected to the fourth detection node NODE_4, to output a low clamping detection signal DET_L.

Herein, since the back-bias voltage normal detector 10A, the back-bias voltage high clamping detector 10C, and the back-bias voltage low clamping detector 10D always have constant back-bias voltage detection levels regardless of a temperature change, they may be implemented in the same circuit configuration. However, since the back-bias voltage normal detector 10A, the back-bias voltage high clamping detector 10C, and the back-bias voltage low clamping detector 10D must have different target back-bias voltage detection levels, their NMOS or PMOS transistors must be different in size.

That is, the sizes of the NMOS or PMOS transistors of the back-bias voltage normal detector 10A are set to detect a back-bias voltage target level value between the back-bias voltage detection level of the back-bias voltage high clamping detector 10C and the back-bias voltage detection level of the back-bias voltage low clamping detector 10D.

The detection signal combining unit 10E includes a first selecting unit 12E, a signal combining unit 14E, and a second selecting unit 16E.

The first selecting unit 12E is configured to select the normal detection signal DET_N outputted from the back-bias voltage normal detector 10A of the modulation detection signal DET_T outputted from the back-bias voltage modulation detector 10B according to a first test signal TEST1 and a fuse option (not illustrated) and output the selected signal as an uncombined detection signal DET_S. The signal combining unit 14E is configured to combine the high clamping detection signal DET_H outputted from the back-bias voltage high clamping detector 10C, the uncombined detection signal DET_S outputted from the first selecting unit 12E, and the low clamping detection signal DET_L outputted from the back-bias voltage low clamping detector 10D to generate a combined detection signal DET_CLP. Herein, the combined detection signal DET_CLP is used to detect the voltage level of the back-bias voltage VBB, whose back-bias voltage detection level varies linearly, in response to the uncombined detection signal DET_S in an intermediate-temperature range, to detect the lowest (absolute) clamping level of the constant back-bias voltage VBB in response to the low clamping detection signal DET_L in a low-temperature (deep cold) range lower than the intermediate-temperature range, and to detect the highest (absolute) clamping level of the constant back-bias voltage VBB in response to the high clamping detection signal DET_H in a high-temperature (deep hot) range higher than the intermediate-temperature range. The second selecting unit 16E is configured to select the uncombined detection signal DET_S or the combined detection signal DET_CLP according to a second test signal TEST2 and a fuse option (not illustrated) and output the selected signal as an enable signal BBEb.

FIG. 3A is a characteristic diagram illustrating a temperature-dependent back-bias voltage (VBB) detection level change in each of the detectors 10A, 10B, 10C and 10D of FIG. 2. FIG. 3B is a characteristic diagram illustrating a change in the back-bias voltage (VBB) detection level clamped by the back-bias voltage detector 10 of FIG. 2.

Referring to FIG. 3A, it can be seen that the normal detection signal DET_N outputted from the back-bias voltage (VBB) normal detector 10A, the high clamping detection signal DET_H outputted from the back-bias voltage (VBB) high clamping detector 10C, and the low clamping detection signal DET_L outputted from the back-bias voltage (VBB) low clamping detector 10D detect the voltage level of the back-bias voltage VBB on the basis of a specific target level even in a temperature change.

On the other hand, it can be seen that a target level for detection of the voltage level of the back-bias voltage VBB for the modulation detection signal DET_T outputted from the back-bias voltage (VBB) modulation detector 10B varies according to a temperature change. That is, it can be seen that the voltage level of the back-bias voltage VBB is detected on the basis of a relatively low target level (absolute value) at a relatively low temperature whereas the voltage level of the back-bias voltage VBB is detected on the basis of a relatively high target level (absolute value) at a relatively high temperature.

Referring to FIG. 3B, it can be seen that the characteristics of the enable signal BBEb outputted to the oscillator 20 vary according to the temperature ranges due to the operation of the detection signal combining unit 10E.

When the normal detection signal DET_N (among the normal detection signal DET_N and the modulation detection signal DET_T) is selected and outputted as the uncombined detection signal DET_S by the first selecting unit 12E of the detection signal combining unit 10, the enable signal BBEb with characteristics determined according to the normal detection signal DET_N is outputted regardless of the operations of the signal combining unit 14E and the second selecting unit 16E. That is, if the voltage level (absolute value) of the back-bias voltage VBB is higher than the normal target level (absolute value) determined by the back-bias voltage normal detector 10A, both of the logic levels of the normal detection signal DET_N and the enable signal BBEb become high; and if the voltage level (absolute value) of the back-bias voltage VBB is lower than the determined normal target level (absolute value), both of the logic levels of the normal detection signal DET_N and the enable signal BBEb become low. In this case, as illustrated in the drawings, since the normal target level (absolute value) does not change according to a temperature change, the logic level of the enable signal BBEb is not affected by the temperature change.

On the other hand, when the modulation detection signal DET_T (among the normal detection signal DET_N and the modulation detection signal DET_T) is selected and outputted as the uncombined detection signal DET_S by the first selecting unit 12E and the uncombined detection signal DET_S (among the uncombined detection signal DET_S and the combined detection signal DET_DLP) is selected and outputted as the enable signal BBEb by the second combining unit 16E, the enable signal BBEb with characteristics determined according to the modulation detection signal DET_T is outputted. That is, if the voltage level (absolute value) of the back-bias voltage VBB is higher than the modulation target level (absolute value) determined by the back-bias voltage modulation detector 10B, both of the logic levels of the modulation detection signal DET_T and the enable signal BBEb become high; and if the voltage level (absolute value) of the back-bias voltage VBB is lower than the determined modulation target level (absolute value), both of the logic levels of the modulation detection signal DET_T and the enable signal BBEb become low. In this case, as illustrated in the drawings, since the modulation target level (absolute value) changes according to a temperature change, the logic level of the enable signal BBEb is affected by the temperature change.

When the modulation detection signal DET_T (among the normal detection signal DET_N and the modulation detection signal DET_T) is selected and outputted as the uncombined detection signal DET_S by the first selecting unit 12E and the combined detection signal DET_CLP (among the uncombined detection signal DET_S and the combined detection signal DET_DLP) is selected and outputted as the enable signal BBEb by the second combining unit 16E, the enable signal BBEb with characteristics determined according to a combination of the modulation detection signal DET_T, the high clamping detection signal DET_H and the low clamping detection signal DET_L is outputted. That is, if the voltage level (absolute value) of the back-bias voltage VBB becomes lower than the lowest (absolute) clamping level of the back-bias voltage VBB, the logic level of the enable signal BBEb is determined according to the logic level of the low clamping detection signal DET_L regardless of the logic level of the modulation detection signal DET_T; if the voltage level (absolute value) of the back-bias voltage VBB becomes higher than the highest (absolute) clamping level of the back-bias voltage VBB, the logic level of the enable signal BBEb is determined according to the logic level of the high clamping detection signal DET_H regardless of the logic level of the modulation detection signal DET_T; and if the voltage level (absolute value) of the back-bias voltage VBB lies between the lowest (absolute) clamping level of the back-bias voltage VBB and the highest (absolute) clamping level of the back-bias voltage VBB, the logic level of the enable signal BBEb is determined according to the logic level of the modulation detection signal DET_T.

The conventional back-bias voltage generator can control the target level of the back-bias voltage VBB by means of the back-bias voltage detector 10 at the desire of a user even when the internal temperature of the semiconductor device changes.

However, the premise that the voltage level of the back-bias reference voltage VREFB supplied to the back-bias voltage detector 10 must always maintain the predetermined target level regardless of a temperature change or an external power supply voltage (VDD) level change, must be satisfied so that the back-bias voltage detector 10 of the conventional back-bias voltage generator can operate as described above.

If the voltage level of the external power supply voltage VDD supplied to the semiconductor device is sufficiently high, the above premise can be satisfied by the bandgap reference circuit that is used to generate the reference voltage VREF.

However, when the voltage level of the external power supply voltage VDD supplied to the semiconductor device decreases further according to the requirements for a low-power operation of the semiconductor device, the above premise fails to be satisfied, which causes the following problems.

FIG. 4 is a characteristic diagram illustrating a back-bias voltage (VBB) level change depending on an external power supply voltage (VDD) level change in the conventional back-bias voltage generator. Referring to FIG. 4, it can be seen that the voltage level of the back-bias reference voltage VREFB for the reference voltage VREF is determined at a different point as the voltage level of the external power supply voltage VDD increases.

That is, it can be seen that the reference voltage VREF with a relatively low target voltage level of 0.75 V increases along with the external power supply voltage VDD before the voltage level of the external power supply voltage VDD exceeds a voltage level of 0.75 V, but the reference voltage VREF continues to maintain the target voltage level without any more voltage level increase after the voltage level of the external power supply voltage VDD exceeds the voltage level of 0.75 V.

On the other hand, it can be seen that the back-bias reference voltage VREFB with a relatively high target voltage level of 1.5 V must increase along with the external power supply voltage VDD until the voltage level of the external power supply voltage VDD reaches a voltage level of 1.5 V, and the back-bias reference voltage VREFB continues to maintain the target voltage level without any more voltage level increase after the voltage level of the external power supply voltage VDD exceeds the voltage level of 1.5 V.

Herein, as described above, the back-bias voltage detector 10 of the conventional back-bias voltage generator receives the back-bias reference voltage VREFB to perform an operation of detecting the voltage level of the back-bias voltage VBB. Therefore, as illustrated in the drawings, the voltage level of the back-bias voltage VBB detected by the back-bias voltage detector 10 changes as the voltage level of the back-bias reference voltage VREFB changes.

Specifically, it can be seen that the voltage level of the back-bias voltage VBB fails to maintain a predetermined target level and changes with a change in the voltage level of the back-bias reference voltage VREFB in a period A before the voltage level of the back-bias reference voltage VREFB reaches a predetermined target level, and the back-bias voltage VBB maintains the predetermined target level in a period B after the voltage level of the back-bias reference voltage VREFB reaches the predetermined target level.

Herein, it can be seen that the voltage level of a first back-bias voltage VBB@COLD of the back-bias voltage VBB increases with an increase in the voltage level of the back-bias reference voltage VREFB, whereas the voltage level of a second back-bias voltage VBB@HOT of the back-bias voltage VBB decreases with an increase in the voltage level of the back-bias reference voltage VREFB. The reason for this is that the back-bias voltage normal detector 10A and the back-bias voltage modulation detector 10B have different operational characteristics as the voltage level of the back-bias reference voltage VREFB changes.

In general, the MOS transistors of the back-bias voltage normal detector 10A operate in a saturation state when the back-bias reference voltage VREFB increases. Therefore, the back-bias voltage normal detector 10A performs a detecting operation so that the absolute value of the back-bias voltage VBB can increase further. Also, the MOS transistors of the back-bias voltage modulation detector 10B operate in a linear state when the back-bias reference voltage VREFB increases. Therefore, the back-bias voltage modulation detector 10B performs a detecting operation so that the absolute value of the back-bias voltage VBB can decrease further. Of course, the back-bias voltage high clamping detector 10C and the back-bias voltage low clamping detector 10D have the same characteristics as the back-bias voltage normal detector 10A.

Thus, the first back-bias voltage VBB@COLD will be the back-bias voltage VBB generated according to the detecting operation of the back-bias voltage modulation detector 10B, and the second back-bias voltage VBB@HOT will be the back-bias voltage VBB generated according to the detecting operation of the back-bias voltage normal detector 10A.

Due to these characteristics, the back-bias voltage modulation detector 10B and the back-bias voltage normal detector 10A can perform the opposite detecting operations. As illustrated in the drawings, such a feature becomes more apparent as the voltage level of the back-bias reference voltage VREFB increases. It can be seen that the back-bias voltage modulation detector 10B and the back-bias voltage normal detector 10A can stably perform the completely opposite detecting operations after the voltage level of the back-bias reference voltage VREFB reaches the predetermined target level.

However, as the voltage level of the external power supply voltage VDD supplied to the semiconductor device decreases further according to the requirements for a low-power operation of the semiconductor device, the back-bias voltage modulation detector 10B and the back-bias voltage normal detector 10A cannot perform the opposite detecting operations, so that the separate configuration of the back-bias voltage modulation detector 10B and the back-bias voltage normal detector 10A becomes meaningless.

That is, as illustrated in the graph of FIG. 4, if the voltage level of the external power supply voltage VDD becomes 1 V, the back-bias voltage modulation detector 10B and the back-bias voltage normal detector 10A perform the detecting operations with the same characteristics, so that it is unnecessary to provide the back-bias voltage modulation detector 10B and the back-bias voltage normal detector 10A separately.

Actually, an external power supply voltage VDD with a voltage level of 2.5 V is supplied for a DDR DRAM; an external power supply voltage VDD with a voltage level of 1.8 V is supplied for a DDR2 DRAM; an external power supply voltage VDD with a voltage level of 1.5 V is supplied for a DDR3 DRAM; and an external power supply voltage VDD with a voltage level of 1.2 V is supplied for a DDR4 DRAM that is developed recently.

When this trend is analyzed on the basis of the graph of FIG. 4, it can be seen that the DDR DRAM, the DDR1 DRAM, the DDR2 DRAM and the DDR3 DRAM can be stably operated using the conventional back-bias voltage generating circuit, but the DDR4 DRAM cannot be stably operated even using the conventional back-bias voltage generating circuit.

As described above, because the voltage level of the external power supply voltage VDD continues to decrease with the development of new semiconductor devices, there is a possibility that the voltage level of the external power supply voltage VDD may decrease below 1 V. If a new semiconductor device operated by an external power supply voltage VDD with a voltage level of below 1 V is developed, the new semiconductor device cannot operate according to the intention of a designer even when using the conventional back-bias voltage generating circuit, so that it is difficult to expect the normal operation.

SUMMARY OF THE INVENTION

Embodiments of the present invention are directed to provide an internal voltage generator of a semiconductor device that operates stably even in a low power supply voltage environment by generating a power supply voltage, which is supplied thereto, in a charge pumping mode.

In accordance with an aspect of the present invention, there is provided an internal voltage generator of a semiconductor device including: a charge pumping unit configured to receive an external power supply voltage to perform a charge pumping operation on the basis of the voltage level of a reference voltage to generate a charge pumped voltage having a voltage level higher than the external power supply voltage; and an internal voltage generating unit configured to receive the charge pumped voltage to perform a charge pumping operation on the basis of an internal voltage level linear with respect to a temperature change in a first temperature range to generate an internal voltage, and to perform a charge pumping operation on the basis of an internal voltage clamping level that is constant independent of a temperature change in a second temperature range to generate the internal voltage.

The internal voltage generating unit may include a first voltage detecting unit configured to receive the charge pumped voltage to detect the internal voltage level dependent linearly on the temperature change; a second voltage detecting unit configured to receive the charge pumped voltage to detect the internal voltage clamping level that is constant with respect to the temperature change; a detection signal combining unit configured to combine a first detection signal and a second detection signal outputted from the first voltage detecting unit and the second voltage detecting unit to generate a combined detection signal detecting the internal voltage level with an internal voltage detection level that changes linearly in the first temperature range and an internal voltage clamping level that is constant in the second temperature range; and an internal voltage generator unit configured to generate the internal voltage in a charge pumping mode in response to the combined detection signal.

In accordance with another aspect of the present invention, there is provided an voltage generator of a semiconductor device including: a pumping power supply voltage generating unit configured to receive an external power supply voltage to perform a charge pumping operation on the basis of the voltage level of a reference voltage to generate a pumping power supply voltage having a voltage level higher than the external power supply voltage; and an internal voltage generating unit configured to receive the pumping power supply voltage to perform a charge pumping operation on the basis of an internal voltage level that is linear with respect to a temperature change in a first temperature range to generate an internal voltage, to perform a charge pumping operation on the basis of an internal voltage lowest clamping level constant with respect to a temperature change in a second temperature range lower than the first temperature range to generate the internal voltage, and to perform a charge pumping operation on the basis of an internal voltage highest clamping level that is constant independent of a temperature change in a third temperature range higher than the first temperature range to generate the internal voltage.

The internal voltage generating unit includes a first voltage detecting unit configured to receive the pumping power supply voltage to detect the internal voltage level that is linearly dependent on the temperature change; a second voltage detecting unit configured to receive the pumping power supply voltage to detect the internal voltage lowest clamping level that is constant with respect to the temperature change; a third voltage detecting unit configured to receive the pumping power supply voltage to detect the internal voltage highest clamping level that is constant with respect to the temperature change; a detection signal combining unit configured to combine a first detection signal, a second detection signal, and a third detection signal outputted from the first voltage detecting unit, the second voltage detecting unit, and the third voltage detecting unit to generate a combined detection signal detecting the internal voltage level with an internal voltage detection level that changes linearly in the first temperature range, the internal voltage lowest clamping level that is constant in the second temperature range, and the internal voltage highest clamping level that is constant in the third temperature range; and an internal voltage generator unit configured to generate the internal voltage in a charge pumping mode in response to the combined detection signal.

In accordance with another aspect of the present invention, there is provided an internal voltage generator of a semiconductor device including: a charge pumping unit configured to receive an external power supply voltage to perform a charge pumping operation on the basis of the voltage level of a reference voltage to generate a charge pumped voltage having a voltage level higher than the external power supply voltage; and an internal voltage generating unit configured to receive the charge pumped voltage to perform a charge pumping operation on the basis of an internal voltage level that is linear with respect to a temperature change in a first temperature range in a first operation mode selectable according to a test signal and a fuse option to generate an internal voltage, to perform a charge pumping operation on the basis of an internal voltage lowest clamping level that is constant with respect to a temperature change in a second temperature range lower than the first temperature range to generate the internal voltage, to perform a charge pumping operation on the basis of an internal voltage highest clamping level that is constant with respect to a temperature change in a third temperature range higher than the first temperature range to generate the internal voltage, and to perform a charge pumping operation on the basis of an internal voltage target level that is constant independent of the temperature change in all of the first to third temperature ranges in a second operation mode selectable according to the test signal and the fuse option to generate the internal voltage, the internal voltage target level being higher than the constant internal voltage lowest clamping level and lower than the constant internal voltage highest clamping level.

The internal voltage generating unit includes a first voltage detecting unit configured to receive the pumping power supply voltage to detect the internal voltage level that is linearly dependent on the temperature change; a second voltage detecting unit configured to receive the pumping power supply voltage to detect the internal voltage lowest clamping level that is constant independent of the temperature change; a third voltage detecting unit configured to receive the pumping power supply voltage to detect the internal voltage highest clamping level that is constant independent of the temperature change; a fourth voltage detecting unit configured to receive the pumping power supply voltage to detect the internal voltage target level that is constant independent of the temperature change, the internal voltage target level being higher than the constant internal voltage lowest clamping level and lower than the constant internal voltage highest clamping level; a first selecting unit configured to output a first detection signal outputted from the first voltage detecting unit or a fourth detection signal outputted from the fourth voltage detecting unit as an uncombined detection signal according to a first fuse option and a first test signal; a detection signal combining unit configured to combine the uncombined detection signal, a second detection signal outputted from the second voltage detecting unit, and a third detection signal outputted from the third voltage detecting unit to generate a combined detection signal detecting the internal voltage level with an internal voltage detection level that changes linearly in the first temperature range, the internal voltage lowest clamping level that is constant in the second temperature range, and the internal voltage highest clamping level that is constant in the third temperature range; a second selecting unit configured to output the uncombined detection signal or the combined detection signal as an enable signal according to a second fuse option and a second test signal; and an internal voltage generator unit configured to generate the internal voltage in a charge pumping mode in response to the enable signal.

DESCRIPTION OF SPECIFIC EMBODIMENTS

Other objects and advantages of the present invention can be understood by the following description, and become apparent with reference to the embodiments of the present invention.

The invention may, however, be embodied in many different forms and should not be construed as being limited to the embodiments set forth herein. Rather, these embodiments are provided so that this disclosure will be thorough and complete, and will fully convey the concept of the invention to those skilled in the art.

Figure 5:
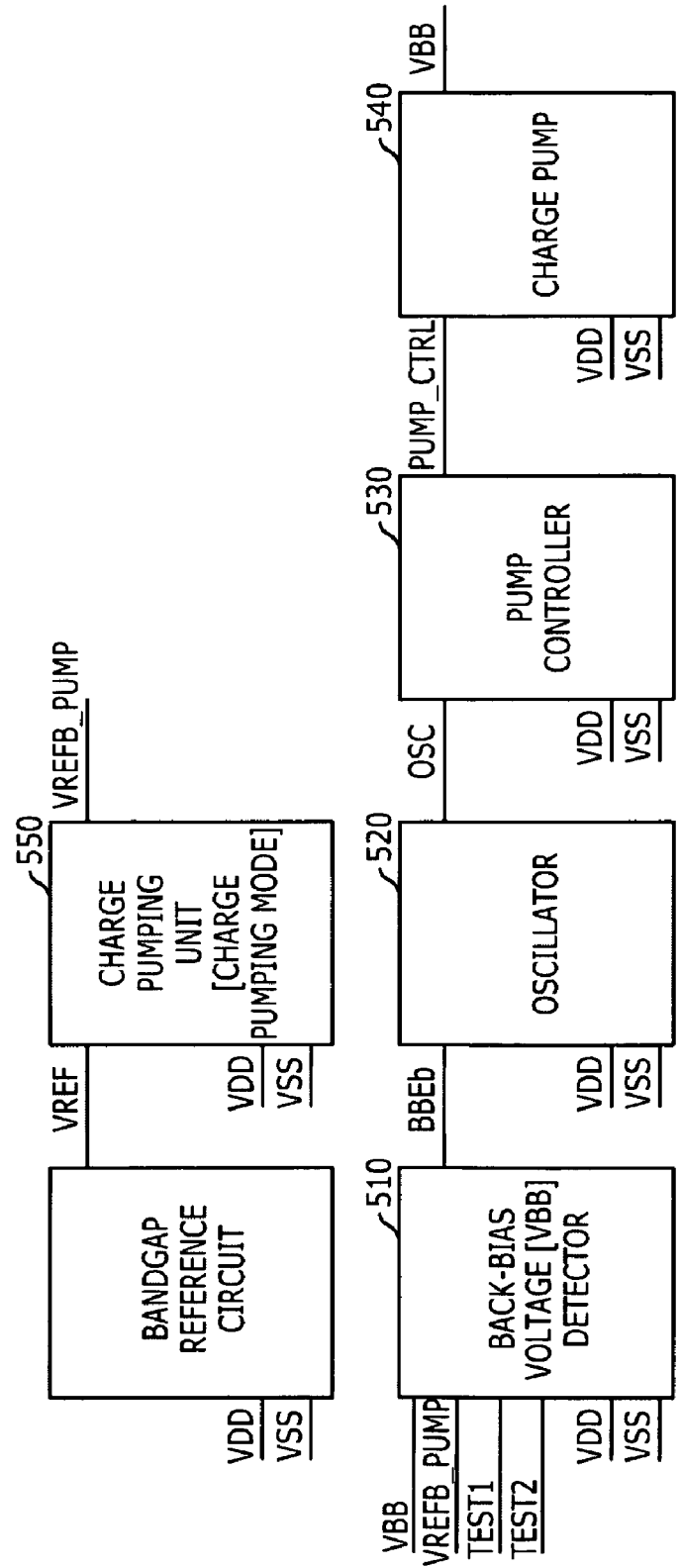
FIG. 5 is a block diagram of a back-bias voltage generator in accordance with an embodiment of the present invention.

FIG. 5 is a block diagram of a back-bias voltage (VBB) generator in accordance with an embodiment of the present invention.

For reference, the configuration of an internal voltage generating circuit including an oscillator 520, a pump controller 530, and a charge pump 540, except a back-bias voltage detector 510 and a charge pumping unit 550, among the components of the back-bias voltage generator in accordance with an embodiment of the present invention is identical to that of the conventional internal voltage generating circuit, and thus its detailed description will be omitted for conciseness. Referring to FIG. 5, the back-bias voltage generator in accordance with an embodiment of the present invention includes a charge pumping unit 550, a back-bias voltage detector 510, an oscillator 520, a pump controller 530, and a charge pump 540. The charge pumping unit 550 is configured to receive an external power supply voltage VDD to perform a charge pumping operation on the basis of the voltage level of a reference voltage VREF to generate a charge pumped voltage VREFB_PUMP that maintains a predetermined target level. The back-bias voltage detector 510 is configured to receive the charge pumped voltage VREFB_PUMP and a back-bias voltage VBB, which is fed back from a back-bias voltage output terminal, to output an enable signal BBEb. The oscillator 520 is configured to output an oscillation signal OSC with a predetermined oscillation frequency in response to the enable signal BBEb. The pump controller 530 is configured to receive the oscillation signal OSC to generate a pump control signal PUMP_CTRL. The charge pump 540 is configured to perform a negative charge pumping operation on the back-bias voltage output terminal in response to the pump control signal PUMP_CTRL.

Herein, the reference voltage VREF always maintains the predetermined target level regardless of a temperature change and a voltage level change of the external power supply voltage VDD. In general, the reference voltage VREF is generated by a bandgap reference circuit that operates by receiving the external power supply voltage VDD.

Figure 6:
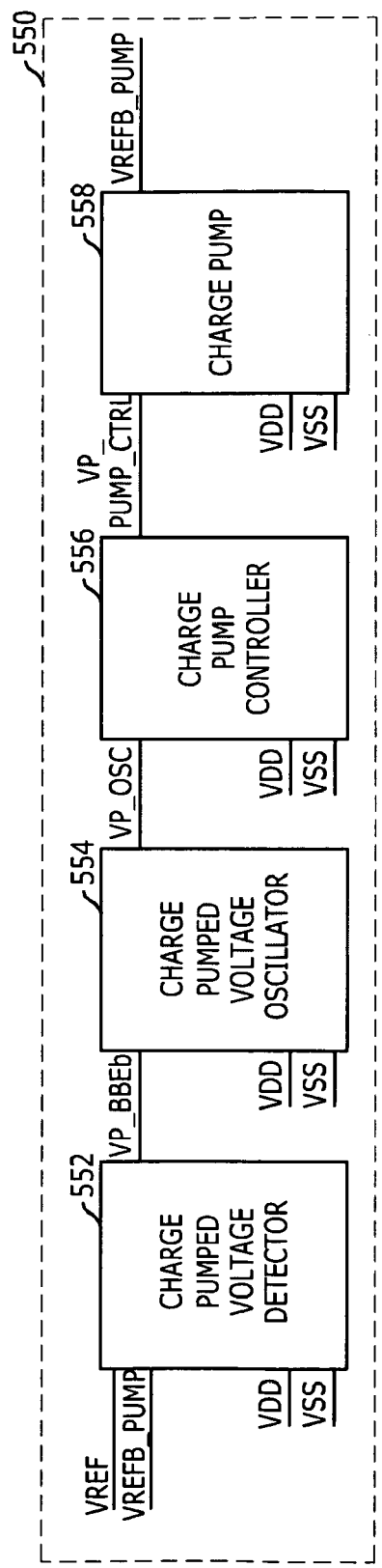
FIG. 6 is a block diagram illustrating a charge pumping unit of FIG. 5.

FIG. 6 is a block diagram illustrating the structure of a charge pumping unit of FIG. 5. Referring to FIG. 6, the charge pumping unit 550 includes a charge pumped voltage detector 552, a charge pumped voltage oscillator 554, a charge pump controller 556, and a charge pump 558. The charge pumped voltage detector 552 is configured to receive the external power supply voltage VDD and the charge pumped voltage VREFB_PUMP fed back from a charge pumped voltage (VREFB_PUMP) output terminal, detect the voltage level of the charge pumped voltage VREFB_PUMP on the basis of the reference voltage VREF, and output a charge pumped voltage enable signal VP_BBEb. The charge pumped voltage oscillator 554 is configured to output a charge pumped voltage oscillation signal VP_OSC with a predetermined oscillation frequency in response to the charge pumped voltage enable signal VP_BBEb. The charge pump controller 556 is configured to receive the charge pumped voltage oscillation signal VP_OSC to generate a charge pump control signal VP_PUMP_CTRL. The charge pump 558 is configured to perform a positive charge pumping operation on the charge pumped voltage (VREFB_PUMP) output terminal in response to the charge pump control signal VP_PUMP_CTRL.

Figure 7:
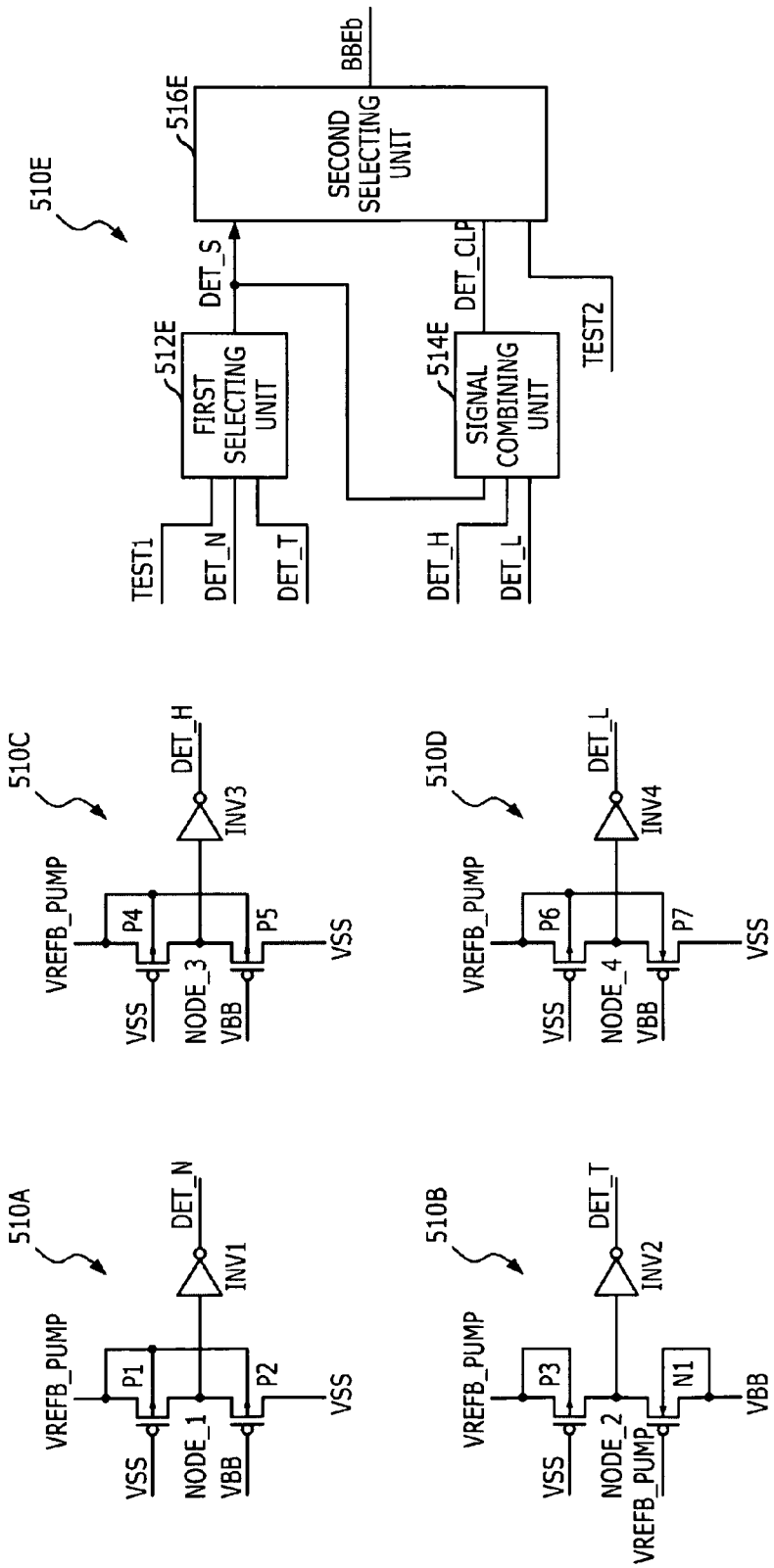
FIG. 7 is a circuit diagram of a back-bias voltage detector 510 of FIG. 5 in accordance with an embodiment of the present invention, which includes a back-bias voltage normal detector 510A, a back-bias voltage modulation detector 510B, a back-bias voltage high clamping detector 510C, and a back-bias voltage low clamping detector 510D, and a detection signal combining unit 510E.

FIG. 7 is a circuit diagram of the back-bias voltage detector 510 of FIG. 5 in accordance with an embodiment of the present invention, which includes a back-bias voltage normal detector 510A, a back-bias voltage modulation detector 510B, a back-bias voltage high clamping detector 510C, and a back-bias voltage low clamping detector 510D, and a detection signal combining unit 510E. Referring to FIG. 7, the back-bias voltage normal detector 510A includes a first PMOS transistor P1, a second PMOS transistor P2, and a first inverter INV1. The first PMOS transistor P1 has a gate connected to receive a ground voltage VSS, a source and a bulk connected to receive a charge pumped voltage VREFB_PUMP, and a drain connected to a first detection node NODE_1. The second PMOS transistor P2 has a gate connected to receive a back-bias voltage VBB, a drain connected to receive the ground voltage VSS, a bulk connected to receive the charge pumped voltage VREFB_PUMP, and a source connected to the first detection node NODE_1. The first inverter INV1 is configured to have an input terminal, which is connected to the first detection node NODE_1, to output a normal detection signal DET_N.

The back-bias voltage modulation detector 510B includes a third PMOS transistor P3, an NMOS transistor N1, and a second inverter INV2. The third PMOS transistor P3 has a gate connected to receive the ground voltage VSS, a source and a bulk connected to receive the pumping power supply voltage VREFB_PUMP, and a drain connected to a second detection node NODE_2. The NMOS transistor N1 has a gate connected to receive the pumping power supply voltage VREFB_PUMP, a source and a bulk connected to receive the back-bias voltage VBB, and a drain connected to the second detection node NODE_2. The second inverter INV2 is configured to have an input terminal, which is connected to the second detection node NODE_2, to output a modulation detection signal DET_T.

The back-bias voltage high clamping detector 510C includes a fourth PMOS transistor P4, a fifth PMOS transistor P5, and a third inverter INV3. The fourth PMOS transistor P4 has a gate connected to receive the ground voltage VSS, a source and a bulk connected to receive the charge pumped voltage VREFB_PUMP, and a drain connected to a third detection node NODE_3. The fifth PMOS transistor P4 has a gate connected to receive the back-bias voltage VBB, a drain connected to receive the ground voltage VSS, a bulk connected to receive the charge pumped voltage VREFB_PUMP, and a source connected to the third detection node NODE_3. The third inverter INV3 is configured to have an input terminal, which is connected to the third detection node NODE_3, to output a high clamping detection signal DET_H.

The back-bias voltage low clamping detector 510D includes a sixth PMOS transistor P6, a seventh PMOS transistor P7, and a fourth inverter INV4. The sixth PMOS transistor P6 has a gate connected to receive the ground voltage VSS, a source and a bulk connected to receive the charge pumped voltage VREFB_PUMP, and a drain connected to a fourth detection node NODE_4. The seventh PMOS transistor P7 has a gate connected to receive the back-bias voltage VBB, a drain connected to receive the ground voltage VSS, a bulk connected to receive the pumping power supply voltage VREFB_PUMP, and a source connected to the fourth detection node NODE_4. The fourth inverter INV4 is configured to have an input terminal, which is connected to the fourth detection node NODE_4, to output a low clamping detection signal DET_L.

Here, since the back-bias voltage normal detector 510A, the back-bias voltage high clamping detector 510C, and the back-bias voltage low clamping detector 510D always have constant back-bias voltage detection levels regardless of a temperature change, they may be implemented in the same circuit configuration. However, since the back-bias voltage normal detector 510A, the back-bias voltage high clamping detector 510C, and the back-bias voltage low clamping detector 510D must have different target back-bias voltage detection levels, their NMOS or PMOS transistors must be different in size.

That is, the sizes of the NMOS or PMOS transistors of the back-bias voltage normal detector 510A are set to detect a back-bias voltage target level value between the back-bias voltage detection level of the back-bias voltage high clamping detector 510C and the back-bias voltage detection level of the back-bias voltage low clamping detector 510D.

The detection signal combining unit 510E includes a first selecting unit 512E, a signal combining unit 514E, and a second selecting unit 516E. The first selecting unit 512E is configured to select the normal detection signal DET_N outputted from the back-bias voltage normal detector 510A of the modulation detection signal DET_T outputted from the back-bias voltage modulation detector 510B according to a first test signal TEST1 and a fuse option (not illustrated) and output the selected signal as an uncombined detection signal DET_S. The signal combining unit 514E is configured to combine the high clamping detection signal DET_H outputted from the back-bias voltage high clamping detector 510C, the uncombined detection signal DET_S outputted from the first selecting unit 512E, and the low clamping detection signal DET_L outputted from the back-bias voltage low clamping detector 510D to generate a combined detection signal DET_CLP. Herein, the combined detection signal DET_CLP is used to detect the voltage level of the back-bias voltage VBB, whose back-bias voltage detection level varies linearly, in response to the uncombined detection signal DET_S in an intermediate-temperature range, to detect the lowest (absolute) clamping level of the constant back-bias voltage VBB in response to the low clamping detection signal DET_L in a low-temperature (deep cold) range lower than the intermediate-temperature range, and to detect the highest (absolute) clamping level of the constant back-bias voltage VBB in response to the high clamping detection signal DET_H in a high-temperature (deep hot) range higher than the intermediate-temperature range. The second selecting unit 516E is configured to select the uncombined detection signal DET_S or the combined detection signal DET_CLP according to a second test signal TEST2 and a fuse option (not illustrated) and output the selected signal as an enable signal BBEb.

Figure 1:
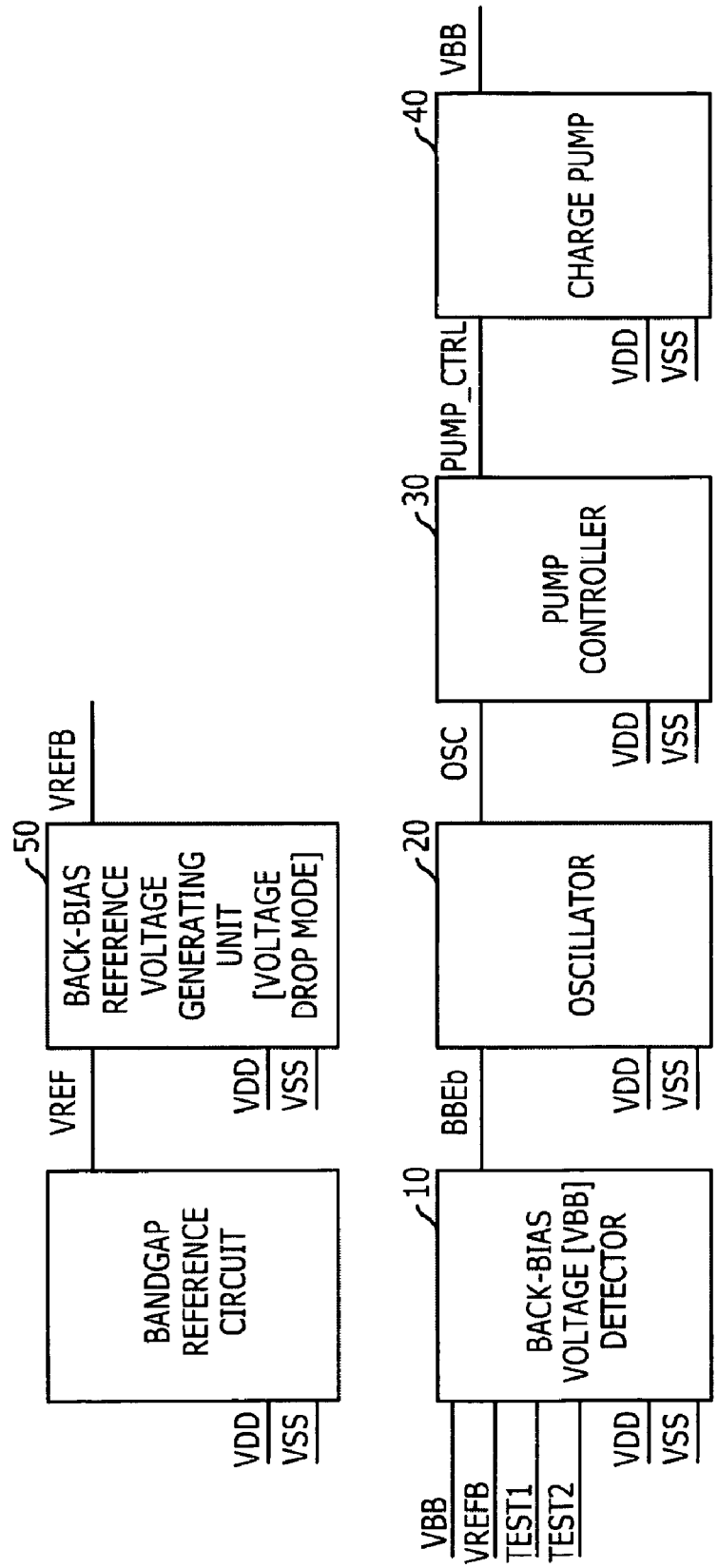
FIG. 1 is a block diagram of a conventional back-bias voltage generator.
Figure 2:
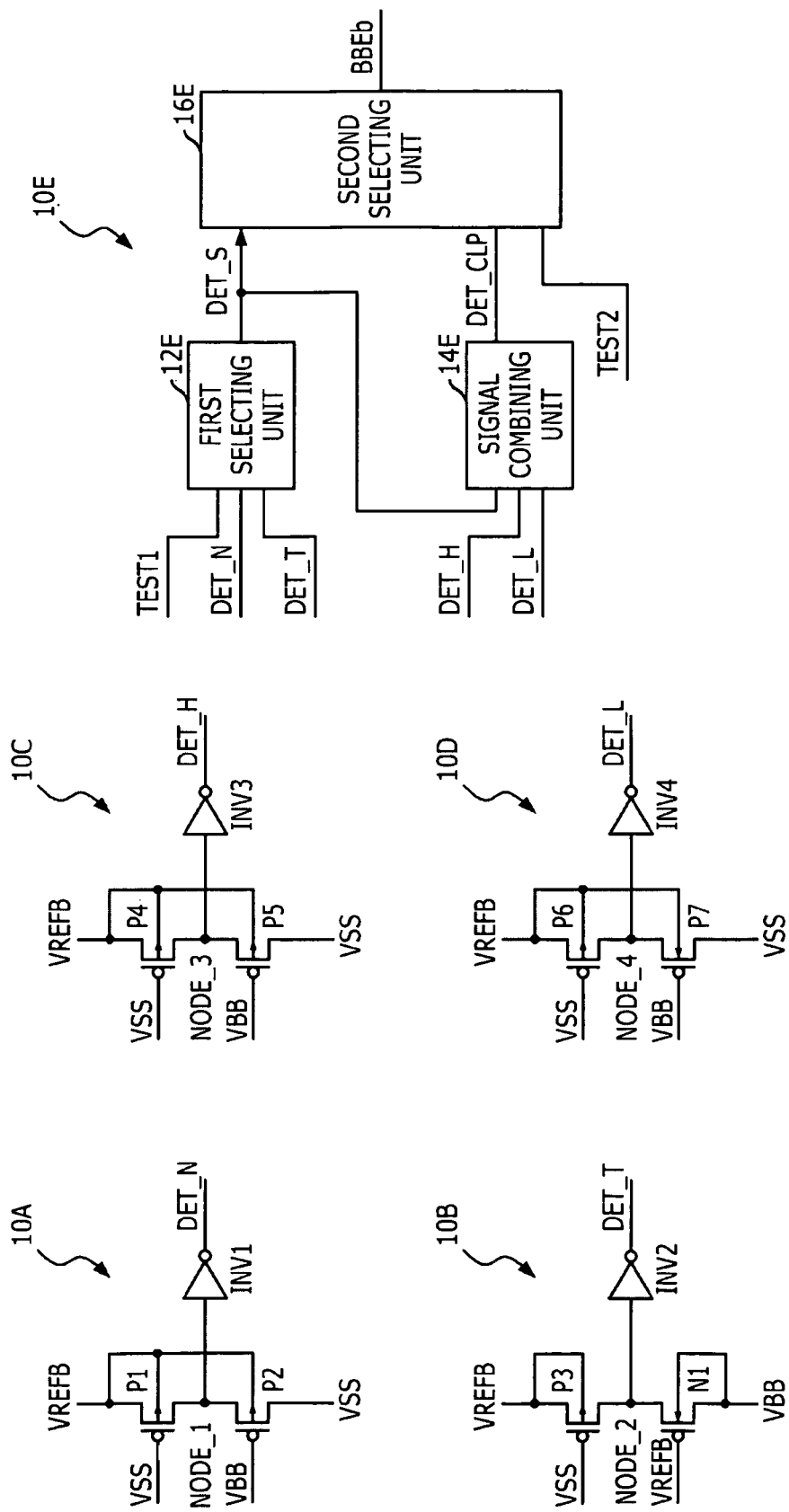
FIG. 2 is a circuit diagram of a back-bias voltage detector 10 of FIG. 1, which includes a back-bias voltage normal detector 10A, a back-bias voltage modulation detector 10B, a back-bias voltage high clamping detector 10C, and a back-bias voltage low clamping detector 10D, and a detection signal combining unit 10E.
Figure 3A:
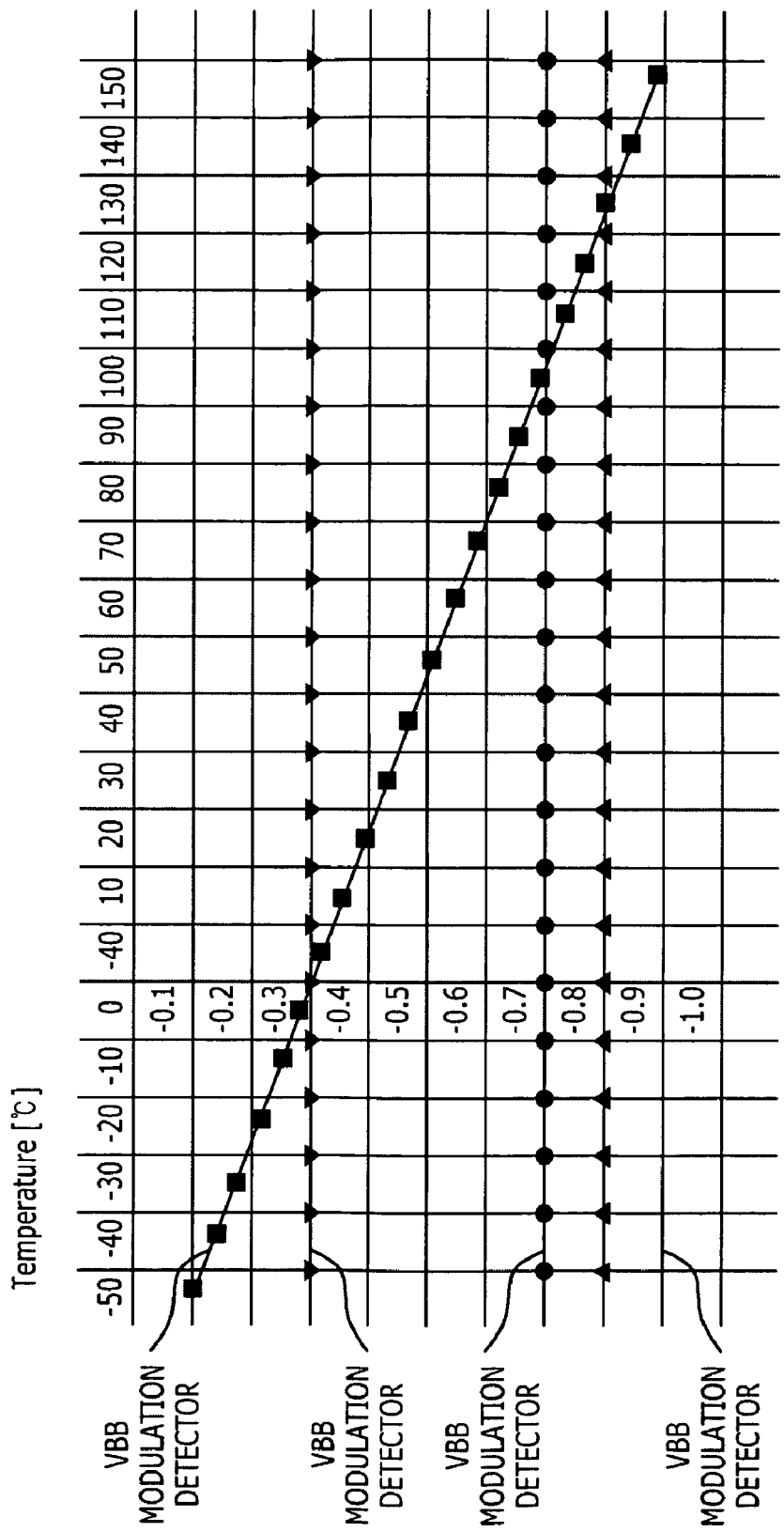
FIG. 3A is a diagram illustrating a temperature-dependent back-bias voltage (VBB) detection level change in each of the detectors 10A, 10B, 10C and 10D of FIG. 2.
Figure 3B:
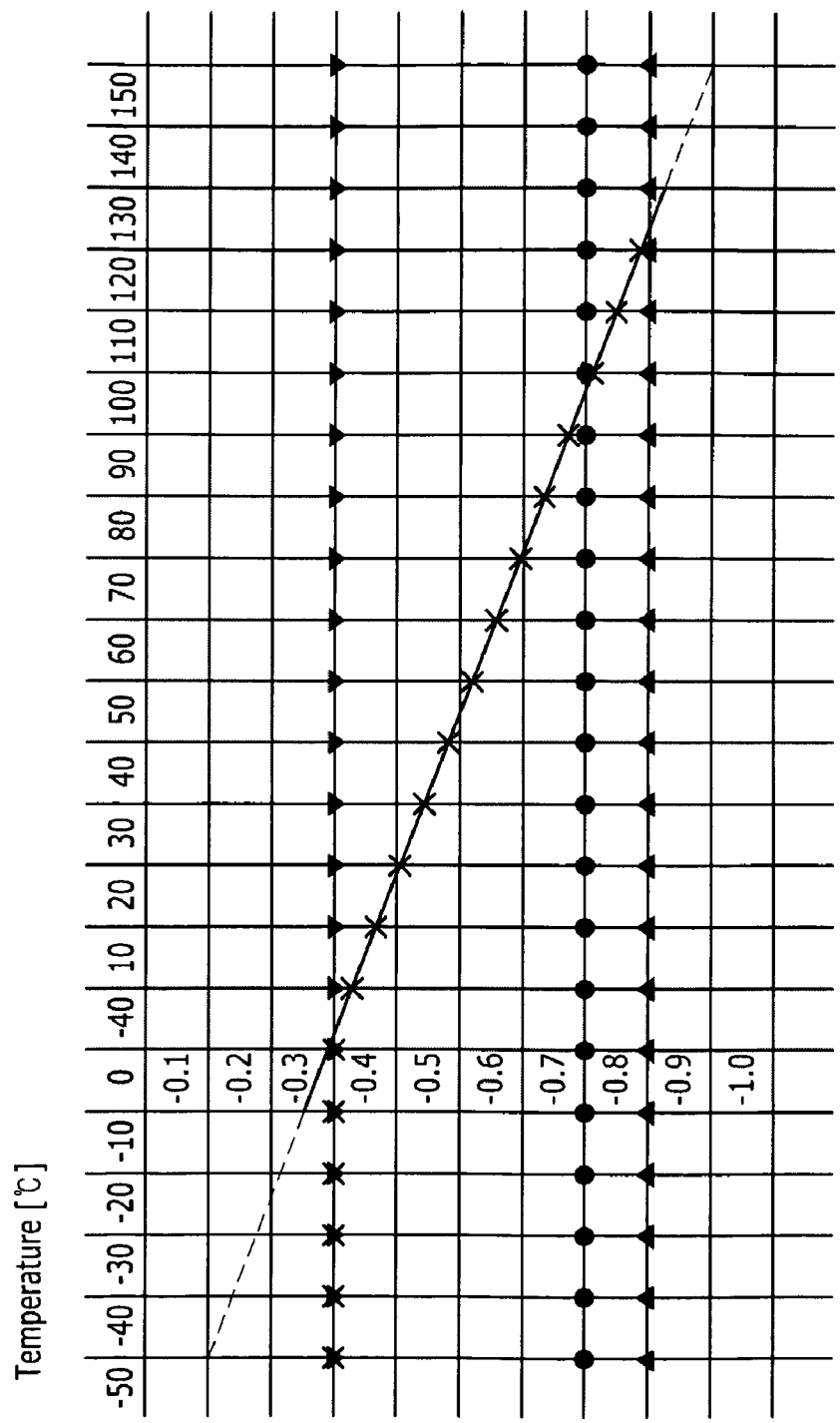
FIG. 3B is a diagram illustrating a change in the back-bias voltage detection level clamped by the back-bias voltage detector 10 of FIG. 2.

The back-bias voltage normal detector 510A, the back-bias voltage modulation detector 510B, the back-bias voltage high clamping detector 510C, and the back-bias voltage low clamping detector 510D provided in the back-bias voltage detector 510 illustrated in FIG. 7 in accordance with an embodiment of the present invention are identical in circuit configuration to the back-bias voltage normal detector 10A, the back-bias voltage modulation detector 10B, the back-bias voltage high clamping detector 10C, and the back-bias voltage low clamping detector 10D provided in the conventional back-bias voltage detector 10 illustrated in FIG. 2. Thus, the operation of the back-bias voltage detector 510 illustrated in FIG. 7 in accordance with an embodiment of the present invention also has the same characteristics as illustrated in FIGS. 3A and 3B.

However, the difference is that the back-bias reference voltage VREFB is supplied to the conventional back-bias voltage detector 10 illustrated in FIG. 2, whereas the pumping power supply voltage VREFB_PUMP is supplied to the back-bias voltage detector 510 illustrated in FIG. 7 in accordance with an embodiment of the present invention.

Figure 8:
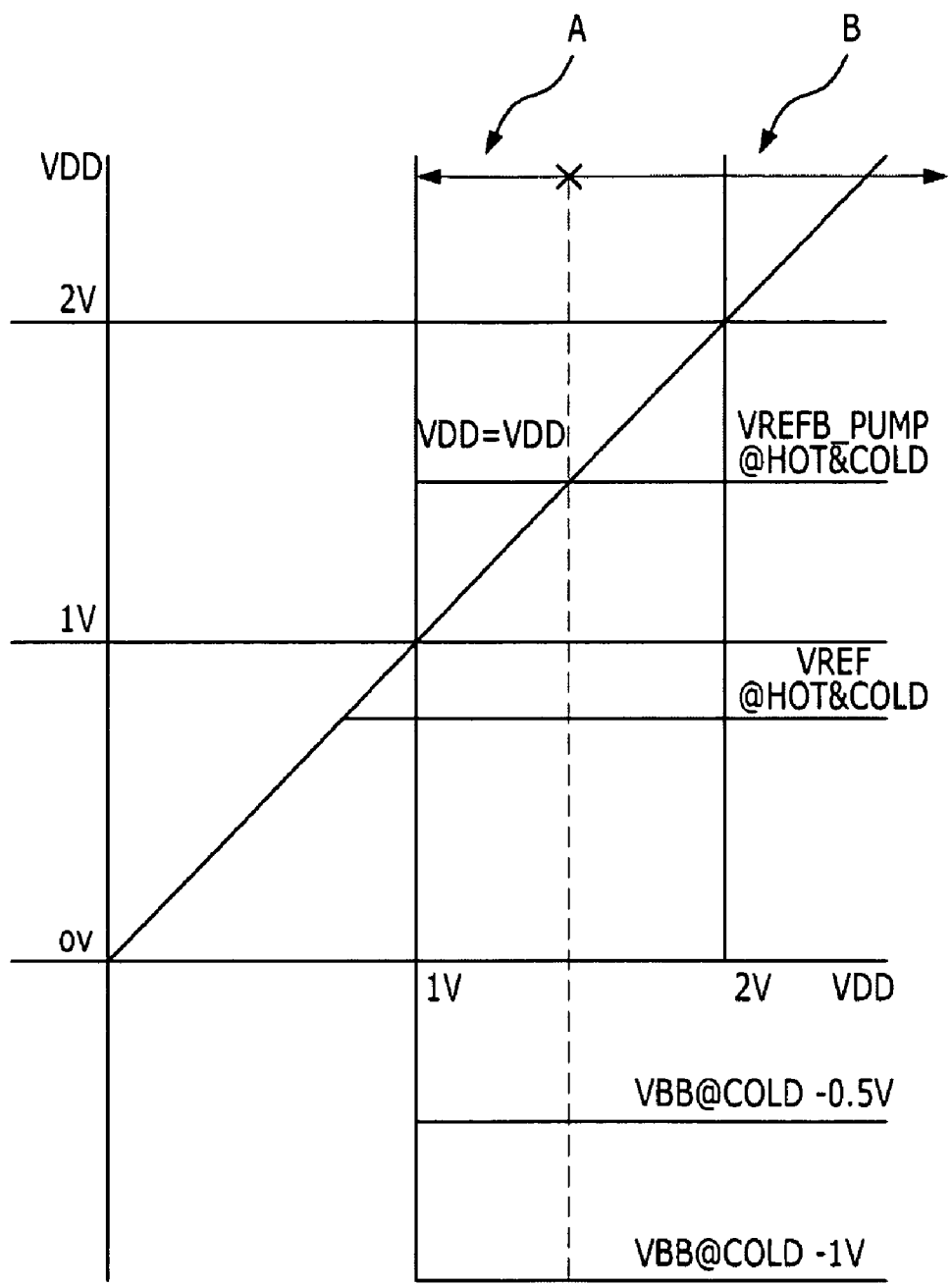
FIG. 8 is a characteristic diagram illustrating a back-bias voltage (VBB) level change depending on an external power supply voltage (VDD) level change in the back-bias voltage generator in accordance with an embodiment of the present invention.

FIG. 8 is a characteristic diagram illustrating a back-bias voltage (VBB) level change depending on an external power supply voltage (VDD) level change in the back-bias voltage generator in accordance with an embodiment of the present invention. Referring to FIG. 8, it can be seen that the target voltage level of the reference voltage VREF is set at a point determined according to the increase of the voltage level of the external power supply voltage VDD, whereas the voltage level of the pumping power supply voltage VREFB_PUMP is set regardless of the increase of the voltage level of the external power supply voltage VDD.

That is, it can be seen that the reference voltage VREF with a relatively low target voltage level of 0.75 V, which is generated by the bandgap reference circuit by means of the external power supply voltage VDD, increases along with the external power supply voltage VDD before the voltage level of the external power supply voltage VDD exceeds a voltage level of 0.75 V, but the reference voltage VREF continues to maintain the target voltage level without any more voltage level increase after the voltage level of the external power supply voltage VDD exceeds the voltage level of 0.75 V.

On the other hand, it can be seen that the charge pumped voltage VREFB_PUMP with a relatively high target voltage level of 1.5 V maintains the target voltage level regardless of an external power supply voltage (VDD) level change after reaching the target voltage level of 1.5 V even before the voltage level of the external power supply voltage VDD reaches 1.5 V.

Herein, as described above, the back-bias voltage detector 510 of the back-bias voltage generator in accordance with an embodiment of the present invention receives the charge pumped voltage VREFB_PUMP to perform an operation of detecting the voltage level of the back-bias voltage VBB. Therefore, as illustrated in the drawings, the voltage level of the back-bias voltage VBB also reaches the target level regardless of the external power supply voltage (VDD) level change when the voltage level of the charge pumped voltage VREFB_PUMP reaches the target level.

Specifically, since the voltage level of the charge pumped voltage VREFB_PUMP can reach the target level regardless of the voltage level of the external power supply voltage VDD, there can be a period A where the voltage level of the charge pumped voltage VREFB_PUMP is higher than the voltage level of the external power supply voltage VDD. In this way, the voltage level of the charge pumped voltage VREFB_PUMP continues to maintain the target level even in a period B where the voltage level of the external power supply voltage VDD becomes higher than the voltage level of the charge pumped voltage VREFB_PUMP.

Thus, the back-bias voltage VBB generated by the back-bias voltage generator using the charge pumped voltage VREFB_PUMP as a power supply voltage can always maintain the target level both in the period A where the voltage level of the charge pumped voltage VREFB_PUMP is higher than the voltage level of the external power supply voltage VDD and in the period B where the voltage level of the external power supply voltage VDD becomes higher than the voltage level of the pumping power supply voltage VREFB_PUMP.

Figure 4:
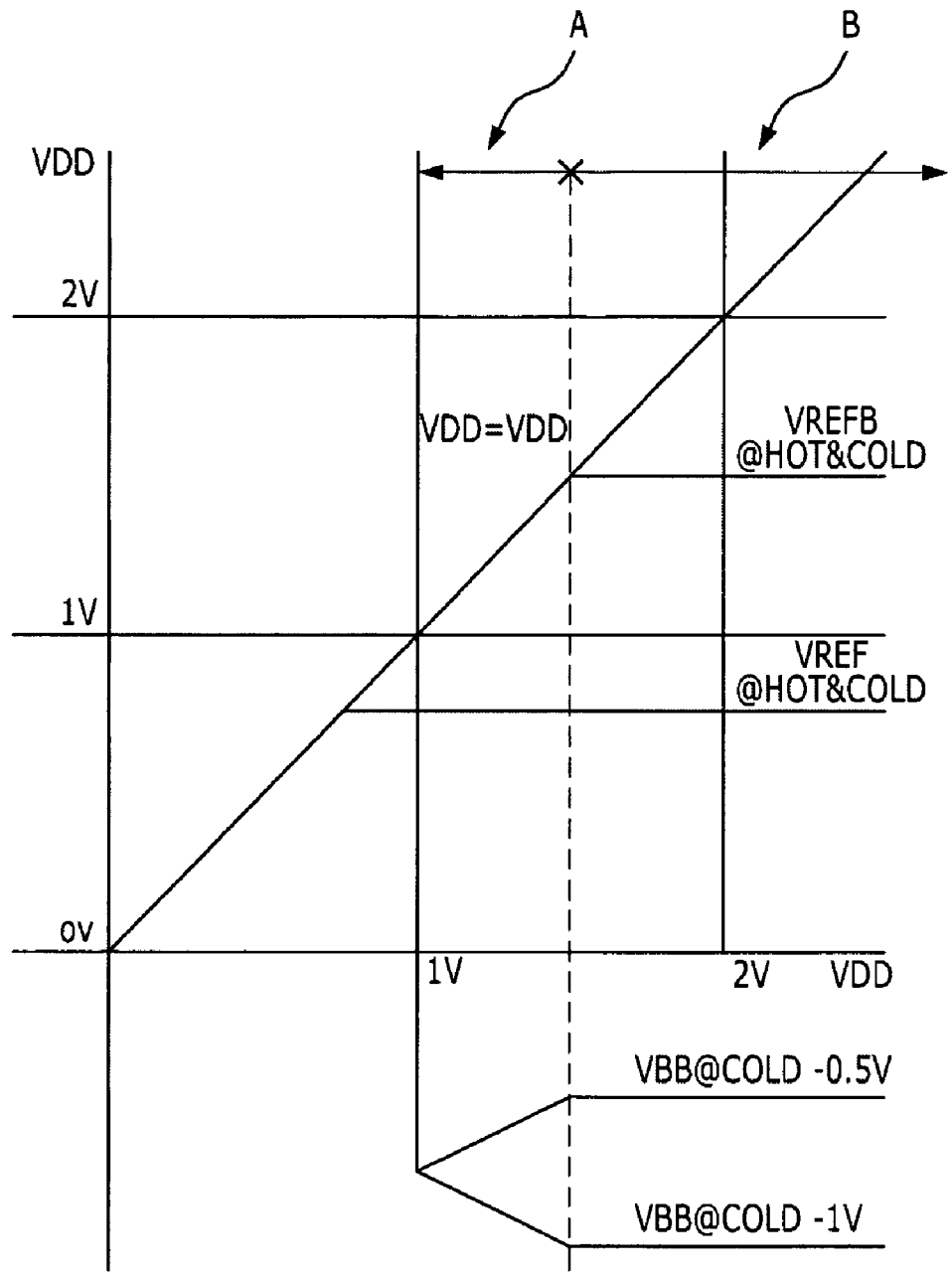
FIG. 4 is a diagram illustrating a back-bias voltage (VBB) level change depending on an external power supply voltage (VDD) level change in the conventional back-bias voltage generator.

Herein, it can be seen that both a first back-bias voltage VBB@COLD of the back-bias voltage VBB and a second back-bias voltage VBB@HOT of the back-bias voltage VBB maintain the target level from the starting point, as in the conventional back-bias voltage generator illustrated in FIG. 4. Since the voltage level of the charge pumped voltage VREFB_PUMP supplied as a power supply voltage does not change after reaching the target level, the first back-bias voltage VBB@COLD generated by the back-bias voltage normal detector 510A maintains the target level from the starting point and also the second back-bias voltage VBB@HOT maintains the target level from the starting point. Thus, the back-bias voltage normal detector 510A and the back-bias voltage modulation detector 510B, which has different operational characteristics, can operate with the opposite characteristics from the starting point.

In accordance with the embodiments of the present invention described above, the voltage level of the charge pumped voltage VREFB_PUMP supplied to the back-bias voltage detector 510 can be set regardless of the voltage level of the external power supply voltage VDD. Therefore, the back-bias voltage detector 510 can be stably operated even in a low power supply voltage environment where the external power supply voltage VDD with a very low voltage level is supplied to the semiconductor device. Thus, the operation of the back-bias voltage generator can be stabilized.

Thus, even in the low power supply voltage environment, the power consumption can be reduced by increasing a refresh time in a high temperature environment and the device reliability and throughput can be improved by securing a write recovery time (tWR) margin in a low temperature environment.

Also, the back-bias voltage VBB is prevented from changing excessively at very high temperatures or at very low temperatures, thereby making it possible to prevent the malfunction.

For example, although the aforesaid embodiment has exemplified the case of clamping both the absolute highest value and the absolute lowest value of the back-bias voltage (VBB) detection level, the present invention can also be applied to the case of using only one of the back-bias voltage (VBB) high clamping detector and the back-bias voltage (VBB) low clamping detector.

Also, although the aforesaid embodiment has exemplified the case of using the back-bias voltage VBB, the present invention can also be applied to the case of using the high-level voltage VPP generated through the charge pumping operation.

Also, the locations and types of the logic gates and transistors exemplified in the aforesaid may vary according to the polarities of signals inputted thereto.

As described above, the use of the present invention makes it possible to operate the back-bias voltage detector stably even in the low power supply voltage environment.

Thus, even in the low power supply voltage environment, the present invention can reduce the power consumption by increasing a refresh time in a high temperature environment and can improve the device reliability and throughput by securing a tWR margin in a low temperature environment. Also, the present invention prevents the back-bias voltage VBB from changing excessively at very high temperatures or at very low temperatures, thereby making it possible to prevent the malfunction.

While the present invention has been described with respect to the specific embodiments, it will be apparent to those skilled in the art that various changes and modifications may be made without departing from the spirit and scope of the invention as defined in the following claims.

What is claimed is:

1. An internal voltage generator of a semiconductor device, comprising:
    a charge pumping unit configured to receive an external power supply voltage, to perform a charge pumping operation on the basis of the voltage level of a reference voltage and to generate a charge-pumped voltage; and
    an internal voltage generating unit configured to receive the charge-pumped voltage, to perform a charge pumping operation on the basis of an internal voltage level that is linear to a temperature change in a first temperature range to generate an internal voltage, and to perform a charge pumping operation on the basis of an internal voltage clamping level that is constant regardless of a temperature change in a second temperature range to generate the internal voltage,
    wherein the charge-pumped voltage is charge pumped to have a first voltage level higher than the received external power supply voltage when the received external power supply voltage reaches a minimum operation voltage of the semiconductor device.

2. The internal voltage generator of claim 1, wherein the internal voltage generating unit includes:
    a first voltage detecting unit configured to receive the charge pumped voltage to detect the internal voltage level that is linearly dependent on the temperature change;
    a second voltage detecting unit configured to receive the charge pumped voltage to detect the internal voltage clamping level that is constant with respect to the temperature change;
    a detection signal combining unit configured to combine a first detection signal and a second detection signal outputted from the first voltage detecting unit and the second voltage detecting unit to generate a combined detection signal detecting the internal voltage level with an internal voltage detection level that changes linearly in the first temperature range and an internal voltage clamping level that is constant in the second temperature range; and
    an internal voltage generator unit configured to generate the internal voltage in a charge pumping mode in response to the combined detection signal.

3. The internal voltage generator of claim 2, further comprising:
    a reference voltage generating unit configured to receive the external power supply voltage to generate the reference voltage that always maintains a predetermined target level regardless of a temperature change and a voltage level change of the external power supply voltage.

4. The internal voltage generator of claim 2, wherein the charge pumped voltage generating unit includes:
    a charge pumped voltage detector configured to detect the voltage level of the charge pumped voltage on the basis of the voltage level of the reference voltage;
    a charge pumped voltage oscillator configured to output a charge pumped voltage oscillation signal with a predetermined oscillation frequency in response to the output signal of the charge pumped voltage detector;
    a charge pump controller configured to receive the charge pumped voltage oscillation signal to generate a charge pump control signal; and
    a charge pump configured to perform a positive charge pumping operation on a charge pumped voltage output terminal in response to the charge pump control signal.

5. The internal voltage generator of claim 2, wherein the second temperature range is lower than the first temperature range.

6. The internal voltage generator of claim 2, wherein the second temperature range is higher than the first temperature range.

7. The internal voltage generator of claim 2, wherein the internal voltage generating unit includes:
an oscillator configured to output an oscillation signal with a predetermined oscillation frequency by using the combined detection signal as an enable signal;
a pump controller configured to receive the oscillation signal to generate a pump control signal; and
a charge pump configured to perform a negative charge pumping operation on a back-bias voltage output terminal in response to the pump control signal.

8. The internal voltage generator of claim 7, wherein the first voltage detecting unit includes:
a first PMOS transistor having a gate connected to receive a ground voltage, a source and a bulk connected to receive the charge pumped voltage, and a drain connected to a first detection node;
an NMOS transistor having a gate connected to receive the charge pumped voltage, a source and a bulk connected to receive a back-bias voltage, and a drain connected to the first detection node; and
a first inverter having an input terminal connected to the first detection node to output a first detection signal.

9. The internal voltage generator of claim 8, wherein the second voltage detecting unit includes:
a second PMOS transistor having a gate connected to receive the ground voltage, a source and a bulk connected to receive the charge pumped voltage, and a drain connected to a second detection node;
a third PMOS transistor having a gate connected to receive the back-bias voltage, a drain connected to receive the ground voltage, a bulk connected to receive the charge pumped voltage, and a source connected to the second detection node; and
a second inverter having an input terminal connected to the second detection node to output a second detection signal.

10. An internal voltage generator of a semiconductor device, comprising:
a charge pumping unit configured to receive an external power supply voltage, to perform a charge pumping operation on the basis of the voltage level of a reference voltage and to generate a charge pumped voltage; and
an internal voltage generating unit configured to receive the charge pumped voltage to perform a charge pumping operation on the basis of an internal voltage level linear to a temperature change in a first temperature range to generate an internal voltage, to perform a charge pumping operation on the basis of an internal voltage lowest clamping level that is constant regardless of a temperature change in a second temperature range lower than the first temperature range to generate the internal voltage, and to perform a charge pumping operation on the basis of an internal voltage highest clamping level that is constant regardless of a temperature change in a third temperature range higher than the first temperature range to generate the internal voltage,
wherein the charge-pumped voltage is charge pumped to have a first voltage level higher than the received external power supply voltage when the received external power supply voltage reaches a minimum operation voltage of the semiconductor device.

11. The internal voltage generator of claim 10, wherein the internal voltage generating unit includes:
a first voltage detecting unit configured to receive the charge pumped voltage to detect the internal voltage level that is linearly dependent on the temperature change;
a second voltage detecting unit configured to receive the charge pumped voltage to detect the internal voltage lowest clamping level that is constant regardless of the temperature change;
a third voltage detecting unit configured to receive the charge pumped voltage to detect the internal voltage highest clamping level that is constant regardless of the temperature change;
a detection signal combining unit configured to combine a first detection signal, a second detection signal, and a third detection signal outputted from the first voltage detecting unit, the second voltage detecting unit, and the third voltage detecting unit to generate a combined detection signal detecting the internal voltage level with an internal voltage detection level that changes linearly in the first temperature range, the internal voltage lowest clamping level that is constant in the second temperature range, and the internal voltage highest clamping level that is constant in the third temperature range; and
an internal voltage generator unit configured to generate the internal voltage in a charge pumping mode in response to the combined detection signal.

12. The internal voltage generator of claim 11, further comprising:
a reference voltage generating unit configured to receive the external power supply voltage to generate the reference voltage that maintains a predetermined target level regardless of a temperature change and a voltage level change of the external power supply voltage.

13. The internal voltage generator of claim 11, wherein the charge pump unit includes:
a charge pumped voltage detector configured to detect the voltage level of the charge pumped voltage on the basis of the voltage level of the reference voltage;
a charge pumped voltage oscillator configured to output a charge pumped voltage oscillation signal with a predetermined oscillation frequency in response to the output signal of the charge pumped voltage detector;
a charge pump controller configured to receive the charge pumped voltage oscillation signal to generate a charge pump control signal; and
a charge pump configured to perform a positive charge pumping operation on a charge pumped voltage output terminal in response to the charge pump control signal.

14. The internal voltage generator of claim 11, wherein the internal voltage generating unit includes:
an oscillator configured to output an oscillation signal with a predetermined oscillation frequency by using the combined detection signal as an enable signal;
a pump controller configured to receive the oscillation signal to generate a pump control signal; and
a charge pump configured to perform a negative charge pumping operation on a back-bias voltage output terminal in response to the pump control signal.

15. The internal voltage generator of claim 14, wherein the first voltage detecting unit includes:
a first PMOS transistor having a gate connected to receive a ground voltage, a source and a bulk connected to receive the charge pumped voltage, and a drain connected to a first detection node;
an NMOS transistor having a gate connected to receive the charge pumped voltage, a source and a bulk connected to receive a back-bias voltage, and a drain connected to the first detection node; and
a first inverter having an input terminal connected to the first detection node to output the first detection signal.

16. The internal voltage generator of claim 15, wherein the second voltage detecting unit includes:
- a second PMOS transistor having a gate connected to receive the ground voltage, a source and a bulk connected to receive the charge pumped voltage, and a drain connected to a second detection node;
- a third PMOS transistor having a gate connected to receive the back-bias voltage, a drain connected to receive the ground voltage, a bulk connected to receive the charge pumped voltage, and a source connected to the second detection node; and
- a second inverter having an input terminal connected to the second detection node to output the second detection signal.

17. The internal voltage generator of claim 16, wherein the third voltage detecting unit includes:
- a fourth PMOS transistor having a gate connected to receive the ground voltage, a source and a bulk connected to receive the charge pumped voltage, and a drain connected to a third detection node;
- a fifth PMOS transistor having a gate connected to receive the back-bias voltage, a drain connected to receive the ground voltage, a bulk connected to receive the charge pumped voltage, and a source connected to the third detection node; and
- a third inverter having an input terminal connected to the third detection node to output the third detection signal.

18. An internal voltage generator of a semiconductor device, comprising:
- a charge pumping unit configured to receive an external power supply voltage to perform a charge pumping operation on the basis of the voltage level of a reference voltage to generate a charge pumped voltage having a voltage level higher than the external power supply voltage; and
- an internal voltage generating unit configured to receive the charge pumped voltage to perform a charge pumping operation on the basis of an internal voltage level that is linear with respect to a temperature change in a first temperature range in a first operation mode selectable according to a test signal and a fuse option to generate an internal voltage, to perform a charge pumping operation on the basis of an internal voltage lowest clamping level that is constant regardless of a temperature change in a second temperature range lower than the first temperature range to generate the internal voltage, to perform a charge pumping operation on the basis of an internal voltage highest clamping level that is constant regardless of a temperature change in a third temperature range higher than the first temperature range to generate the internal voltage, and to perform a charge pumping operation on the basis of an internal voltage target level that is constant regardless of the temperature change in all of the first to third temperature ranges in a second operation mode selectable according to the test signal and the fuse option to generate the internal voltage, the internal voltage target level being higher than the constant internal voltage lowest clamping level and lower than the constant internal voltage highest clamping level,
- wherein the charge-pumped voltage is charge pumped to have a first voltage level higher than the received external power supply voltage when the received external power supply voltage reaches a minimum operation voltage of the semiconductor device.

19. The internal voltage generator of claim 18, wherein the internal voltage generating unit comprises:
- a first voltage detecting unit configured to receive the charge pumped voltage to detect the internal voltage level that is linearly dependent on the temperature change;
- a second voltage detecting unit configured to receive the charge pumped voltage to detect the internal voltage lowest clamping level that is constant regardless of the temperature change;
- a third voltage detecting unit configured to receive the charge pumped voltage to detect the internal voltage highest clamping level that is constant regardless of the temperature change;
- a fourth voltage detecting unit configured to receive the charge pumped voltage to detect the internal voltage target level that is constant regardless of the temperature change, the internal voltage target level being higher than the constant internal voltage lowest clamping level and lower than the constant internal voltage highest clamping level;
- a first selecting unit configured to output a first detection signal outputted from the first voltage detecting unit or a fourth detection signal outputted from the fourth voltage detecting unit as an uncombined detection signal according to a first fuse option and a first test signal;
- a detection signal combining unit configured to combine the uncombined detection signal, a second detection signal outputted from the second voltage detecting unit, and a third detection signal outputted from the third voltage detecting unit to generate a combined detection signal detecting the internal voltage level with an internal voltage detection level that changes linearly in the first temperature range, the internal voltage lowest clamping level that is constant in the second temperature range, and the internal voltage highest clamping level that is constant in the third temperature range;
- a second selecting unit configured to output the uncombined detection signal or the combined detection signal as an enable signal according to a second fuse option and a second test signal; and
- an internal voltage generator unit configured to generate the internal voltage in a charge pumping mode in response to the enable signal.

20. The internal voltage generator of claim 19, further comprising a reference voltage generating unit configured to receive the external power supply voltage to generate the reference voltage that maintains a predetermined target level regardless of a temperature change and a voltage level change of the external power supply voltage.

21. The internal voltage generator of claim 19, wherein the charge pumping unit includes:
- a charge pumped voltage detector configured to detect the voltage level of the charge pumped voltage on the basis of the voltage level of the reference voltage;
- a charge pumped voltage oscillator configured to output a charge pumped voltage oscillation signal with a predetermined oscillation frequency in response to the output signal of the charge pumped voltage detector;
- a charge pump controller configured to receive the charge pumped voltage oscillation signal to generate a charge pumping power supply voltage pump control signal; and
- a charge pump configured to perform a positive charge pumping operation on a pumping power supply voltage output terminal in response to the charge pump control signal.

22. The internal voltage generator of claim 19, wherein the internal voltage generating unit includes:

an oscillator configured to output an oscillation signal with a predetermined oscillation frequency by using the combined detection signal as an enable signal;

a pump controller configured to receive the oscillation signal to generate a pump control signal; and a charge pump configured to perform a negative charge pumping operation on a back-bias voltage output terminal in response to the pump control signal.

23. The internal voltage generator of claim 22, wherein the first voltage detecting unit includes:

a first PMOS transistor having a gate connected to receive a ground voltage, a source and a bulk connected to receive the charge pumped voltage, and a drain connected to a first detection node;

an NMOS transistor having a gate connected to receive the charge pumped voltage, a source and a bulk connected to receive a back-bias voltage, and a drain connected to the first detection node; and a first inverter having an input terminal connected to the first detection node to output the first detection signal.

24. The internal voltage generator of claim 23, wherein the second voltage detecting unit includes:

a second PMOS transistor having a gate connected to receive the ground voltage, a source and a bulk connected to receive the charge pumped voltage, and a drain connected to a second detection node;

a third PMOS transistor having a gate connected to receive the back-bias voltage, a drain connected to receive the ground voltage, a bulk connected to receive the charge pumped voltage, and a source connected to the second detection node; and a second inverter having an input terminal connected to the second detection node to output the second detection signal.

25. The internal voltage generator of claim 24, wherein the third voltage detecting unit includes:

a fourth PMOS transistor having a gate connected to receive the ground voltage, a source and a bulk connected to receive the charge pumped voltage, and a drain connected to a third detection node;

a fifth PMOS transistor having a gate connected to receive the back-bias voltage, a drain connected to receive the ground voltage, a bulk connected to receive the charge pumped voltage, and a source connected to the third detection node; and a third inverter having an input terminal connected to the third detection node to output the third detection signal.

26. The internal voltage generator of claim 25, wherein the fourth voltage detecting unit includes:

a sixth PMOS transistor having a gate connected to receive the ground voltage, a source and a bulk connected to receive the charge pumped voltage, and a drain connected to a fourth detection node;

a seventh PMOS transistor having a gate connected to receive the back-bias voltage, a drain connected to receive the ground voltage, a bulk connected to receive the charge pumped voltage, and a source connected to the fourth detection node; and a fourth inverter having an input terminal connected to the fourth detection node to output the fourth detection signal.

27. The internal voltage generator of claim 1, wherein the charge-pumped voltage increases linearly with respect to a change in the external power supply voltage before the received external power supply reaches the minimum operation voltage.

28. The internal voltage generator of claim 10, wherein the charge-pumped voltage increases linearly with respect to a change in the external power supply voltage before the received external power supply reaches the minimum operation voltage.

29. The internal voltage generator of claim 18, wherein the charge-pumped voltage increases linearly with respect to a change in the external power supply voltage before the received external power supply reaches the minimum operation voltage.

* * * * *